United States Patent
Lee et al.

(10) Patent No.: US 9,245,908 B2
(45) Date of Patent: Jan. 26, 2016

(54) THIN-FILM TRANSISTOR ARRAY SUBSTRATE, DISPLAY DEVICE INCLUDING THE SAME, AND METHOD OF MANUFACTURING THE THIN-FILM TRANSISTOR ARRAY SUBSTRATE

(71) Applicant: Samsung Display Co., Ltd., Yongin, Gyeonggi-Do (KR)

(72) Inventors: Jeong-Ho Lee, Yongin (KR); Su-Yeon Sim, Yongin (KR); Ju-Won Yoon, Yongin (KR); Seung-Min Lee, Yongin (KR); Wang-Woo Lee, Yongin (KR); Il-Jeong Lee, Yongin (KR); Jung-Kyu Lee, Yongin (KR); Choong-Youl Im, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 12 days.

(21) Appl. No.: 14/243,694

(22) Filed: Apr. 2, 2014

(65) Prior Publication Data

US 2015/0048320 A1    Feb. 19, 2015

(30) Foreign Application Priority Data

Aug. 16, 2013 (KR) ........................ 10-2013-0097324

(51) Int. Cl.
*H01L 27/12* (2006.01)
*H01L 27/32* (2006.01)

(52) U.S. Cl.
CPC ........ *H01L 27/1255* (2013.01); *H01L 27/1237* (2013.01); *H01L 27/1288* (2013.01)

(58) Field of Classification Search
CPC ............ H01L 51/5265; H01L 27/3262; H01L 27/1255; H01L 27/1237; H01L 27/1251; H01L 27/1288
See application file for complete search history.

(56) References Cited

U.S. PATENT DOCUMENTS

| 6,593,592 | B1 * | 7/2003 | Yamazaki et al. | 257/71 |
| 8,541,846 | B2 * | 9/2013 | Saito | 257/365 |
| 8,883,556 | B2 * | 11/2014 | Yamazaki | 438/104 |
| 2001/0055841 | A1 * | 12/2001 | Yamazaki et al. | 438/151 |
| 2003/0141811 | A1 * | 7/2003 | Park et al. | 313/506 |
| 2007/0238227 | A1 * | 10/2007 | Jun et al. | 438/149 |

(Continued)

FOREIGN PATENT DOCUMENTS

| KR | 10-2008-0012789 A | 2/2008 |
| KR | 10-2012-0063745 A | 8/2012 |
| KR | 10-2013-0141189 A | 12/2013 |

*Primary Examiner* — Latanya N Crawford
(74) *Attorney, Agent, or Firm* — Knobbe Martens Olson & Bear LLP

(57) ABSTRACT

A method of manufacturing a thin film transistor (TFT) array substrate is disclosed. In one aspect, the method includes forming an active layer on a substrate, forming a first insulating layer on the substrate to cover the active layer, and forming a first gate electrode on the first insulating layer in an area corresponding to the active layer, doping the active layer with ion impurities, forming a second insulating layer on the first insulating layer to cover the first gate electrode, performing an annealing process on the active layer, forming a lower electrode of a capacitor on the second insulating layer, forming a third insulating layer on the second insulating layer to cover the lower electrode, wherein the third insulating layer has a dielectric constant that is greater than those of the first and second insulating layers, and forming an upper electrode of the capacitor on the third insulating layer.

20 Claims, 7 Drawing Sheets

(56) References Cited

U.S. PATENT DOCUMENTS

| | | |
|---|---|---|
| 2008/0029764 A1 | 2/2008 | Adachi et al. |
| 2012/0146031 A1 | 6/2012 | Lee |
| 2013/0015459 A1* | 1/2013 | Lee et al. .................... 257/72 |
| 2013/0037818 A1* | 2/2013 | Lee et al. .................... 257/72 |
| 2013/0049207 A1 | 2/2013 | Liniger et al. |
| 2013/0056837 A1 | 3/2013 | Ng et al. |
| 2013/0062701 A1 | 3/2013 | Lee et al. |
| 2013/0112975 A1* | 5/2013 | Choi et al. .................... 257/59 |
| 2013/0119388 A1* | 5/2013 | Lee et al. .................... 257/59 |
| 2013/0334508 A1 | 12/2013 | Moon |

\* cited by examiner

THIN-FILM TRANSISTOR ARRAY SUBSTRATE, DISPLAY DEVICE INCLUDING THE SAME, AND METHOD OF MANUFACTURING THE THIN-FILM TRANSISTOR ARRAY SUBSTRATE

CROSS-REFERENCE TO RELATED APPLICATIONS

This application claims the benefit of Korean Patent Application No. 10-2013-0097324, filed on Aug. 16, 2013, in the Korean Intellectual Property Office, the disclosure of which is incorporated herein in its entirety by reference.

BACKGROUND

1. Field

The described technology generally relates to a thin film transistor (TFT) array substrate, a display device including the TFT array substrate, and a method of manufacturing the TFT array substrate.

2. Description of the Related Technology

Display devices such as organic light-emitting diode (OLED) displays or liquid crystal displays (LCDs) include a thin film transistor (TFT), a capacitor, and wiring connecting the components of the displays.

The standard substrate on which a display device is fabricated includes electrical components such as a TFT, a capacitor, and wirings, and the display device operates according to the connections between these components.

SUMMARY OF CERTAIN INVENTIVE ASPECTS

One inventive aspect is a thin film transistor (TFT) array substrate, a display device including the TFT array substrate, and a method of manufacturing the TFT array substrate.

Another aspect is a method of manufacturing a thin film transistor (TFT) array substrate, the method including forming an active layer on a substrate, forming a first insulating layer on the substrate to cover the active layer, and forming a first gate electrode on the first insulating layer in an area corresponding to the active layer, doping the active layer with ion impurities, forming a second insulating layer on the first insulating layer to cover the first gate electrode, performing an annealing process on the active layer, forming a lower electrode of a capacitor on the second insulating layer, forming a third insulating layer on the second insulating layer to cover the lower electrode, wherein the third insulating layer has a dielectric constant that is greater than those of the first and second insulating layers, and forming an upper electrode of the capacitor on the third insulating layer.

The forming of the active layer may include forming a first active layer and a second active layer.

The forming of the lower electrode of the capacitor may include substantially simultaneously forming a second gate electrode in an area corresponding to the second active layer and the lower electrode of the capacitor on the second insulating layer.

The forming of the first gate electrode may include forming the first gate electrode and a third gate electrode in areas respectively corresponding to the first and second active layers.

The doping of the active layer may include doping the first and second active layers with ion impurities.

The third gate electrode may be a floating gate electrode.

The forming of the first and third gate electrodes may include using a halftone mask having a transmission region corresponding to the first gate electrode and a semi-transmission region corresponding to the third gate electrode.

The forming of the first and third gate electrodes may include forming a gate electrode layer on the first insulating layer, irradiating the gate electrode layer using the halftone mask to form the first and third gate electrodes, doping the first and second active layers with ion impurities using the first and third gate electrodes as masks, and etching the third gate electrode from the substrate.

The forming of the upper electrode may include forming over the third insulating layer a source electrode and a drain electrode in areas corresponding to the active layer, and the upper electrode of the capacitor at substantially the same time.

The third insulating layer may have a dielectric constant ranging from about 15 to about 40.

Another aspect is a thin film transistor (TFT) array substrate including an active layer formed on the substrate, a first insulating layer formed on the substrate to cover the active layer, a first gate electrode formed on the first insulating layer in an area corresponding to the active layer, a second insulating layer formed on the first insulating layer to cover the first gate electrode, a lower electrode of a capacitor formed on the second insulating layer, a third insulating layer formed on the second insulating layer to cover the lower electrode and having a dielectric constant that is greater than those of the first and second insulating layers, and an upper electrode of the capacitor formed on the third insulating layer.

The active layer may include a first active layer and a second active layer.

The TFT array substrate may further include a second gate electrode formed on the second insulating layer in an area corresponding to the second active layer, wherein the second gate electrode is formed in the same layer as that of the lower electrode.

The first gate electrode may be formed in a region corresponding to the first active layer and the TFT array substrate may include a third gate electrode formed in a region corresponding to the second active layer, and the third gate electrode is a floating gate electrode.

The active layer may include a source region and a drain region doped with ion impurities, and a channel region connecting the source and drain regions to each other, and the TFT array substrate may further include a source electrode and a drain electrode that are respectively electrically connected to the source and drain regions and are formed on the third insulating layer in regions corresponding to the source and drain regions, wherein the source and drain electrodes are formed in the same layer as that of the upper electrode.

Another aspect is a display device including a plurality of pixels, each including a pixel circuit that includes a plurality of thin film transistors (TFTs) and at least one capacitor and is connected to a plurality of wirings. The pixel circuit includes an active layer located formed on a substrate, a first insulating layer formed on the substrate to cover the active layer, a first gate electrode formed on the first insulating layer in an area corresponding to the active layer, a second insulating layer formed on the first insulating layer to cover the first gate electrode, a lower electrode of the capacitor formed on the second insulating layer, a third insulating layer formed on the second insulating layer to cover the lower electrode, and having a dielectric constant that is greater than those of the first and second insulating layers, and an upper electrode of the capacitor formed on the third insulating layer.

The active layer may include a first active layer and a second active layer.

The display device may further include a second gate electrode formed on the second insulating layer in an area corresponding to the second active layer, wherein the second gate electrode is formed in the same layer as that of the lower electrode.

The first gate electrode may be formed in a region corresponding to the first active layer and the display device may further include a third gate electrode formed in a region corresponding to the second active layer, and the third gate electrode is a floating gate electrode.

The active layer may include a source region and a drain region doped with ion impurities, and a channel region connecting the source and drain regions to each other, and the display device may further include a source electrode and a drain electrode that are respectively electrically connected to the source and drain regions and are formed on the third insulating layer in regions respectively corresponding to the source and drain regions, wherein the source and drain electrodes are formed in the same layer as that of the upper electrode.

The display device may include an organic light-emitting diode (OLED) comprising a first electrode, a second electrode, and an organic emission layer formed between the first and second electrodes.

Another aspect is a thin film transistor (TFT) array substrate, comprising: a first active layer and a second active layer formed over the substrate; a first insulating layer covering the first and second active layers; a first gate electrode and a second gate electrode formed over the first insulating layer to be substantially directly above at least portions of the first and second active layers, respectively, wherein the first and second gate electrodes are formed in different layers.

The above TFT array substrate further comprises: a second insulating layer covering the first gate electrode, wherein the second gate electrode is formed over the second insulating layer; and a lower electrode of a capacitor formed over the second insulating layer, wherein the second gate electrode and the lower electrode are formed in the same layer.

The above TFT array substrate further comprises: a third insulating layer covering the second gate electrode and the lower electrode; and an upper electrode of the capacitor formed over the third insulating layer, wherein the third insulating layer has a dielectric constant greater than those of the first and second insulating layers.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Figure 1:
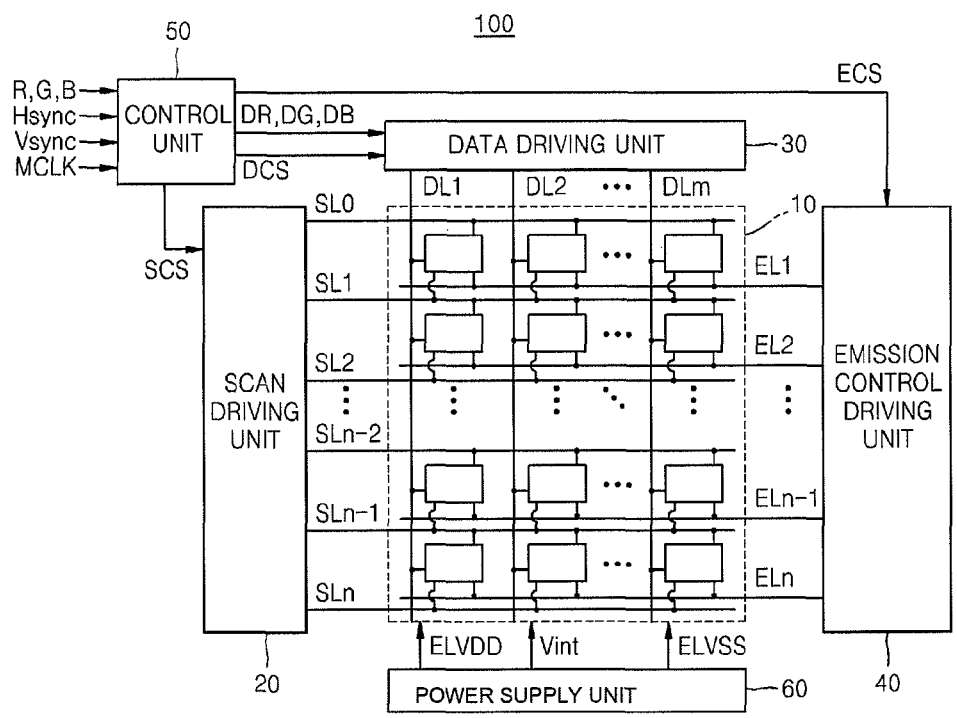
FIG. 1 is a schematic block diagram of a display device according to an embodiment.

Recently, the demand for compact displays having high resolution has been increasing. In such displays, the space available for electrical components such as TFTs, capacitors, and wirings has decreased such that the components have to be compactly arranged. Consequently, space efficient connections therebetween have become more important.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the described technology.

Embodiments of the described technology will be described below in more detail with reference to the accompanying drawings. The components that are the same as or similar to those of preceding embodiments are designated with the same reference numeral regardless of the figure number, and redundant explanations thereof are omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. The term "connected" as used herein includes the term "electrically connected."

Sizes of elements in the drawings may be exaggerated for convenience of explanation. In other words, since sizes and thicknesses of components in the drawings may be exaggerated for convenience of explanation, the described technology not limited thereto. Expressions such as "at least one of," when preceding a list of elements, modify the entire list of elements and do not modify the individual elements of the list.

Figure 2:
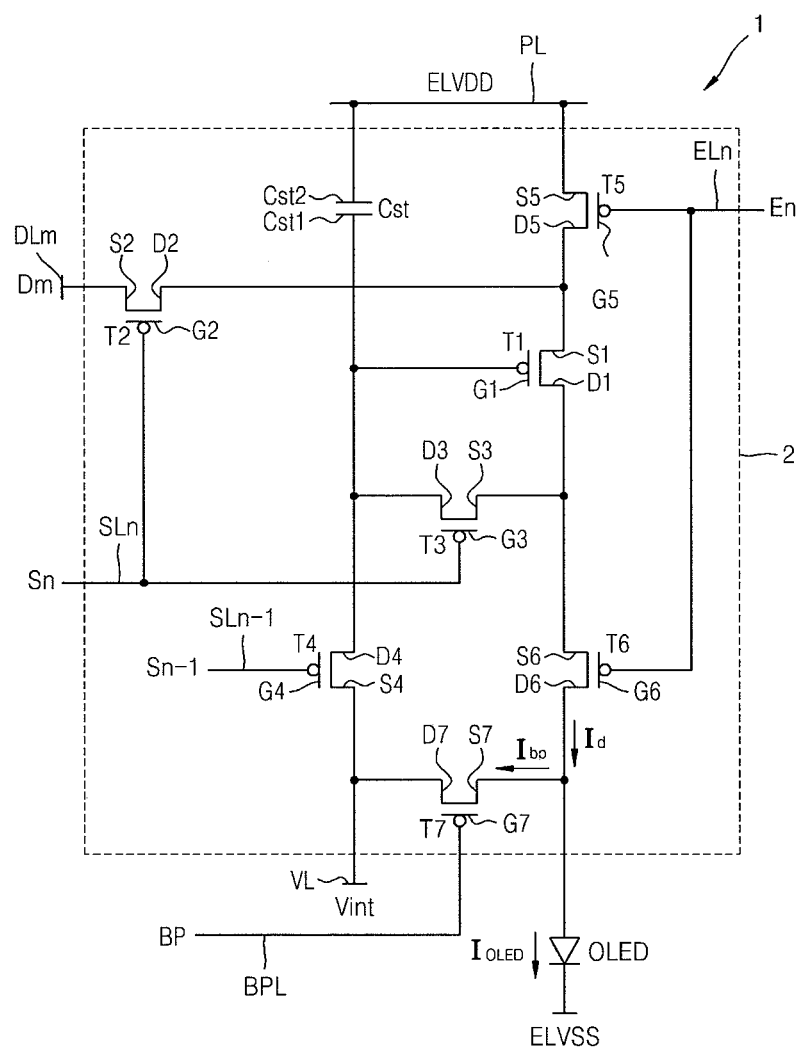
FIG. 2 is an equivalent circuit diagram of a pixel in the display device of FIG. 1 according to an embodiment.

FIG. 1 is a schematic block diagram of a display device 100 according to an embodiment and FIG. 2 is an equivalent circuit diagram of a pixel in the display device 100 according to an embodiment.

The display device 100 includes a display unit (or display panel) 10 including a plurality of pixels, a scan driving unit (or scan driver) 20, a data driving unit (or data driver) 30, an emission control driving unit (or emission control driver) 40, a control unit (or controller) 50, and a power supply unit (or power supply) 60 for supplying an external voltage to the display device 100.

The display unit 10 includes a plurality of pixels that are arranged at the intersections between a plurality of scan lines SL0 through SLn, a plurality of data lines DL1 through DLm, and a plurality of emission control lines EU through ELn in a substantially matrix form. The pixels receive external voltages such as a first power voltage ELVDD, a second power voltage ELVSS, and an initiating voltage Vint from the power supply unit 60. The first power voltage ELVDD may be a voltage of a predetermined high level and the second power voltage ELVSS may be a voltage that is lower than the first power voltage ELVDD or a ground voltage.

Each of the pixels is connected to two scan lines from among the scan lines SL0 through SLn. In FIG. 1, each of the pixels is connected to a scan line of a corresponding pixel line and a previous scan line, however, the described technology is not limited thereto.

Also, each of the pixels is connected to one of the data lines DL1 through DLm and one of the emission control lines EL1 through ELn.

The scan driving unit 20 generates two scan signals and applies the scan signals to each of the pixels via the scan lines SL0 through SLn. That is, the scan driving unit 20 applies a first scan signal through a scan line corresponding to the pixel line of each pixel and applies a second scan signal through a scan line corresponding to a previous pixel line of the corresponding pixel. For example, the scan driving unit 20 applies a first scan signal Sn through an n-th scan line SLn and a second scan signal Sn−1 through an (n−1)th scan line SLn−1 to a pixel formed in an m-th column of an n-th pixel line.

The data driving unit 30 applies data signals D1 through Dm to each of the pixels through the data lines DL1 through DLm.

The emission driving unit 40 generates and applies emission control signals E1 through En to each of the pixels through the emission control lines EU through ELn.

The control unit 50 processes a plurality of input image signals R, G, and B received from an external source to generate a plurality of image data signals DR, DG, and DB and applies the processed image data signals DR, DG, and DB to the data driving unit 30. Also, the control unit 50 receives a vertical synchronization signal Vsync, a horizontal synchronization signal Hsync, and a clock signal MCLK, and generates control signals for controlling the driving of the scan driving unit 20, the data driving unit 30, and the emission driving unit 40. The control unit 50 applies the control signals to the scan driving unit 20, the data driving unit 30, and the emission driving unit 40. That is, the control unit 50 generates a scan driving control signal SCS for controlling the scan driving unit 20, a data driving control signal DCS for controlling the data driving unit 30, and an emission driving control signal ECS for controlling the emission driving unit 40 and applies the control signals to the respective driving units.

Each of the pixels emits light of a predetermined brightness due to a driving current Ioled supplied to an organic light-emitting diode (OLED) according to the data signals D1 through Dm received from the data lines DL1 through DLm.

A pixel 1 shown in FIG. 2 is one of the pixels included in the n-th pixel line. The pixel 1 is connected to a scan line SLn corresponding to the n-th pixel line and a scan line SLn−1 corresponding to an (n−1)th pixel line that is prior to the n-th pixel line.

The pixel 1 includes a pixel circuit 2 including a plurality of thin film transistors (TFTs) T1 through T7 and a storage capacitor Cst. In addition, the pixel 1 includes an OLED that emits light when receiving a driving voltage via the pixel circuit 2.

The TFTs T1 through T7 include a driving TFT T1, a switching TFT T2, a compensation TFT T3, an initiating TFT T4, a first emission control TFT T5, a second emission control TFT T6, and a bypass TFT T7.

The pixel 1 includes a first scan line SLn applying the first scan signal Sn to the switching TFT T2 and the compensation TFT T3 and a second scan line SLn−1 applying a second signal Sn−1 that is the previous scan signal to the initiating TFT T4. The pixel 1 also includes an emission control line ELn applying an emission control signal En to the first and second emission control TFTs T5 and T6 and a data line DLm crossing the first scan line SLn and applying a data signal Dm. The pixel 1 further includes a driving voltage line PL applying the first power voltage ELVDD and formed substantially parallel to the data line DLm, an initiating voltage line VL applying the initiating voltage Vint that initiates the driving TFT T1, and a bypass control line BPL applying a bypass signal BP to the bypass TFT T7.

The gate electrode G1 of the driving TFT T1 is connected to a lower electrode Cst1 of the storage capacitor Cst. The source electrode S1 of the driving TFT T1 is connected to the driving voltage line PL via the first emission control TFT T5. The drain electrode D1 of the driving TFT T1 is electrically connected to the anode of the OLED via the second emission control TFT T6. The driving TFT T1 receives the data signal Dm according to a switching operation of the switching TFT T2 to supply the driving current Ioled to the OLED.

The gate electrode G2 of the switching TFT T2 is connected to the first scan line SLn. The source electrode S2 of the switching TFT T2 is connected to the data line DLm. The drain electrode D2 of the switching TFT T2 is connected to the source electrode S1 of the driving TFT T1 and is also connected to the driving voltage line PL via the first emission control TFT T5. The switching TFT T2 is turned on in response to the first scan signal Sn received from the first scan line SLn to perform a switching operation for transferring the data signal Dm received from the data line DLm to the source electrode S1 of the driving TFT T1.

The gate electrode G3 of the compensation TFT T3 is connected to the first scan line SLn. The source electrode S3 of the compensation TFT T3 is connected to the drain electrode D1 of the driving TFT T1 and is also connected to the anode of the OLED via the second emission control TFT T6. The drain electrode D3 of the compensation TFT T3 is connected to the lower electrode Cst1 of the storage capacitor Cst, the drain electrode D4 of the initiation TFT T4, and the gate electrode G1 of the driving TFT T1. The compensation TFT T3 is turned on in response to the first scan signal Sn received from the first scan line SLn to connect the gate electrode G1 and the drain electrode D1 of the driving TFT T1 to each other.

The gate electrode G4 of the initiation TFT T4 is connected to the second scan line SLn−1. The source electrode S4 of the initiation TFT T4 is connected to an initiation voltage line VL. The drain electrode D4 of the initiation TFT T4 is connected to the lower electrode Cst1 of the storage capacitor Cst, the drain electrode D3 of the compensation TFT T3, and the gate electrode G1 of the driving TFT T1. The initiation TFT T4 is turned on in response to the second scan signal Sn−1 received from the second scan line SLn−1 to perform an initiation operation, in which the initiation voltage Vint is applied to the gate electrode G1 of the driving TFT T1 so as to initiate the voltage of the gate electrode G1 of the driving TFT T1.

The gate electrode G5 of the first emission control TFT T5 is connected to the emission control line ELn. The source electrode of the first emission control TFT T5 is connected to the driving voltage line PL. The drain electrode D5 of the first emission control TFT T5 is connected to the source electrode S1 of the driving TFT T1 and the drain electrode D2 of the switching TFT T2.

The gate electrode G6 of the second emission control TFT T6 is connected to the emission control line ELn. The source electrode S6 of the second emission control TFT T6 is connected to the drain electrode D1 of the driving TFT T1 and the source electrode S3 of the compensation TFT T3. The drain electrode D6 of the second emission control TFT T6 is electrically connected to the anode of the OLED. The first and second emission control TFTs T5 and T6 are substantially simultaneously turned on by the emission control signal En received from the emission control line ELn, and then, the first power voltage ELVDD is applied to the OLED so that the driving current Ioled flows through the OLED.

The gate electrode G7 of the bypass TFT T7 is connected to the bypass control line BPL, the source electrode S7 of the bypass TFT T7 is connected to the drain electrode D6 of the second emission control TFT T6 and the anode of the OLED, and the drain electrode D7 of the bypass TFT T7 is connected to the initiation voltage line VL and the source electrode S4 of the initiation TFT T4.

The bypass TFT T7 causes a partial current Ibp, which is a portion of the driving current Id flowing toward the OLED, to flow through the bypass TFT T7 so that the electric current flowing to the OLED is reduced in the state where the driving TFT T1 is turned off, and thus, a black image may be represented clearly.

The upper electrode Cst2 of the storage capacitor Cst is connected to the driving voltage line PL. The lower electrode Cst1 of the storage capacitor Cst is connected to the gate electrode G1 of the driving TFT T1, the drain electrode D3 of the compensation TFT T3, and the drain electrode D4 of the initiation TFT T4.

The cathode of the OLED is connected to the second power voltage ELVSS. The OLED emits light when receiving the driving current Ioled from the driving TFT T1 to display images.

Figure 3:
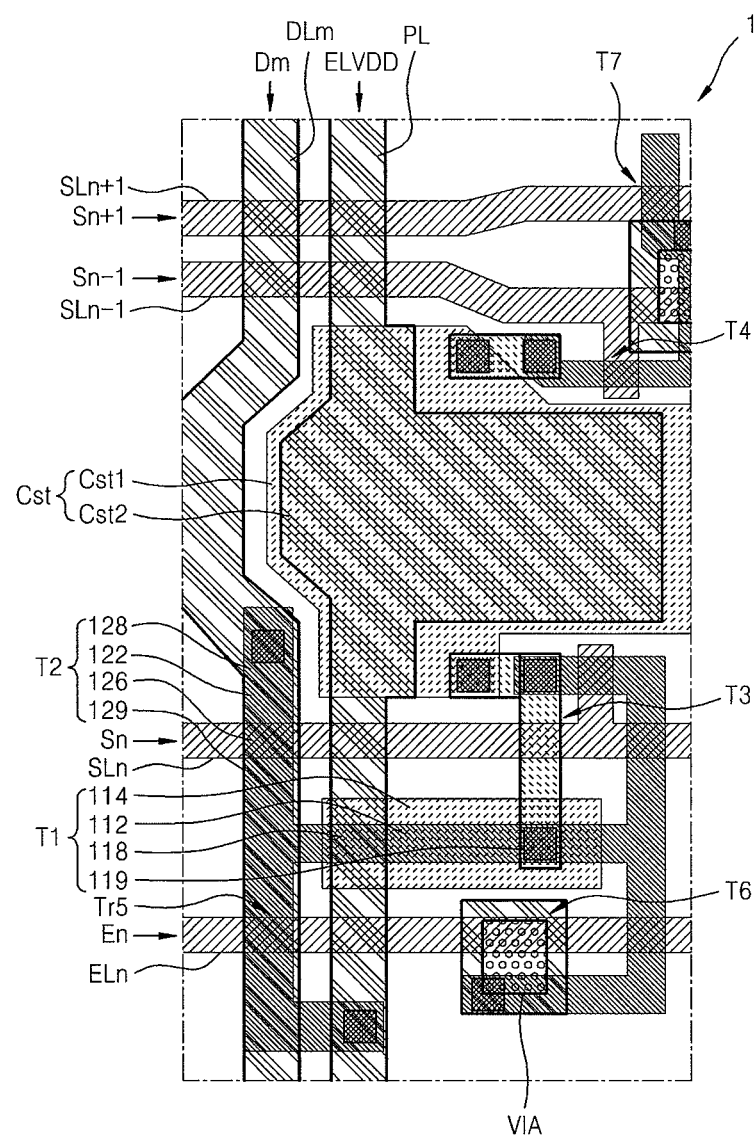
FIG. 3 is a schematic plan view of the pixel shown in FIG. 2.
Figure 4:
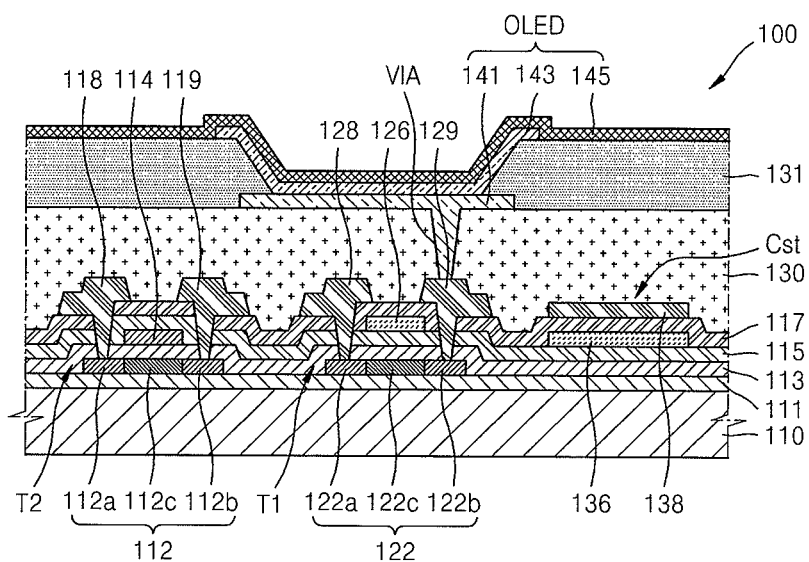
FIG. 4 is a schematic cross-sectional view showing a portion of the display shown in FIG. 3.

FIG. 3 is a schematic plan view of the pixel 1 shown in FIG. 2 and FIG. 4 is a schematic cross-sectional view of a portion of the pixel 1 shown in FIG. 3.

Referring to FIG. 3, the pixel 1 includes a first scan line SLn, a second scan line SLn−1, an emission control line ELn, and a third scan line Sn+1 respectively applying a first scan signal Sn, a second scan signal Sn−1, an emission control signal En, and a third scan signal Sn+1. The first to third scan lines Sn−1 to Sn+1 and the emission control line are formed along a row direction. The pixel 1 also includes a data line DLm and a driving voltage line PL respectively applying a data signal Dm and a first power voltage ELVDD to the pixel 1. The data line DLm and driving voltage line PL cross the first to third scan lines SLn−1 to SLn+1 and the emission control line ELn.

The display device according to the present embodiment includes first signal wirings including first and second gate wirings formed in different layers from each other. The first to third scan line SLn−1 to SLn+1 and the emission control line ELn shown in FIG. 3 may be included in the first gate wirings. However, the described technology is not limited thereto, and at least one of the above wirings may be included in the second gate wirings.

Since the first and second gate wirings are located in different layers from each other, the distances between neighboring gate wirings located in different layers may be reduced, and thus, more pixels may be formed in per unit area. That is, a higher resolution display device may be manufactured.

The data line DLm and the driving voltage line PL are second signal wirings located over the second gate wirings. The second signal wirings cross the first signal wirings including the first gate wirings and the second gate wirings. The second signal wirings are formed as low resistive wirings.

Additionally, the pixel 1 in the display device according to the present embodiment includes a driving TFT T1, a switching TFT T2, a compensation TFT T3, an initiation TFT T4, a first emission control TFT T5, a second emission control TFT T6, a bypass TFT T7, and a storage capacitor Cst. Referring to FIG. 4, an OLED including a first electrode 141, an organic emission layer 143, and a second electrode 145 is formed in a region corresponding to a via hole VIA.

If the OLED is a full-color OLED, the organic emission layer 143 may be include a red emission layer, a green emission layer, or a blue emission layer according to whether the OLED is a red sub-pixel, a green sub-pixel, or a blue sub-pixel.

In addition, the organic emission layer 143 may have a multi-layered structure, in which the red, green, and blue emission layers are stacked, or a single-layered structure including a red, green, and blue emission material so as to emit white light. The OLED including the above organic emission layer 143 may further include red, green, and blue color filters to emit full-color light.

Referring to FIGS. 3 and 4, the driving TFT T1 includes a second active layer 122, a second gate electrode 126, a second source electrode 128, and a second drain electrode 129. Here, the second gate electrode 126 may be included in the second gate wirings.

The switching TFT T2 may include a first active layer 112, a first gate electrode 114, a first source electrode 118, and a first drain electrode 119. Here, the first gate electrode 114 may be included in the first gate wirings.

That is, the first gate electrode 114 and the second gate electrode 126 may be formed in different layers from each other.

In FIG. 4, the driving TFT T1 and the switching TFT T2 are shown, however, the TFTs T1 and T2 may perform other functions.

Referring to FIG. 4, the display device 100 includes the driving TFT T1, the switching TFT T2, and the capacitor Cst formed on a substrate 110.

Hereinafter, the cross-sectional structure of the display device 100 will be described.

The active layers 112 and 122 are formed on the substrate 110. The active layers 112 and 122 may include the first active layer 112 including a first source region 112a, a first drain region 112b, and a first channel region 112c and the second active layer 122 including a second source region 122a, a second drain region 122b, and a second channel region 122c.

The first and second active layers 112 and 122 may be formed of a semiconductor material such as poly-silicon and the first and second source regions 112a and 122a and the first and second drain regions 112b and 122b are doped with ion impurities.

A buffer layer 111 for substantially preventing impurities from penetrating into the first and second active layers 112 and 112 and substantially planarizing the substrate 110 may be formed between the substrate 110 and the first and second active layers 112 and 122. However, according to some embodiments, the buffer layer 111 is not included in the display device 100, based on the design requirements thereof.

A first insulating layer 113 is formed on the first and second active layers 112 and 122 and the first gate electrode 114 is formed on the first insulating layer 113 in a region corresponding to the first active layer 112.

A second insulating layer 115 may be formed on the first gate electrode 114 and the second gate electrode 126 may be formed on the second insulating layer 115 in a region corresponding to the second active layer 122.

Also, a lower electrode 136 of the capacitor Cst is formed on the second insulating layer 115 so as not to overlap with the first and second active layers 112 and 122. That is, the second gate electrode 126 and the lower electrode 136 of the capacitor Cst may be formed in the same layer as each other.

A third insulating layer 117 is formed on the second gate electrode 126 and the lower electrode 136 of the capacitor Cst. The third insulating layer 117 functions as a dielectric layer of the capacitor Cst and has a dielectric constant (k) that is greater than those of the first and second insulating layers 113 and 115. Here, the dielectric constant k may be about 15 or greater.

The first source and first drain electrodes 118 and 119 are respectively electrically connected to the source and drain regions 112a and 112b of the first active layer 112 via contact holes and are formed on the third insulating layer 117. Further, the second source and second drain electrodes 128 and 129 are electrically connected to the source and drain regions 122a and 122b of the second active layer 122 and are formed on the third insulating layer 117. The upper electrode 138 of the capacitor Cst facing the lower electrode 136 of the capacitor Cst is also formed on the third insulating layer 117.

That is, the first and second source electrodes 118 and 128, the first and second drain electrodes 119 and 129, and the upper electrode 138 may be formed in the same layer as each other.

A fourth insulating layer 130 is formed on the first and second source electrodes 118 and 128, the first and second drain electrodes 119 and 129, and the upper electrode 138. The first electrode 141 of the OLED, which is electrically connected to the second drain electrode 129 of the driving TFT T1 through a via hole VIA formed in the first insulating layer 130, is formed on the fourth insulating layer 130.

The organic emission layer 143 is formed on the first electrode 141 and the second electrode 145 is formed on the organic emission layer 143. Here, a pixel defining layer 131 that defines an emission region may be formed on both ends of the first electrode 141.

That is, the OLED may include the first electrode 141, the organic emission layer 143, and the second electrode 145, and may further include at least one of a hole injection layer (HIL), a hole transport layer (HTL), an electron transport layer (ETL), or an electron injection layer (EIL) between the first electrode 141 and the second electrode 145, in addition to the organic emission layer 143. The described technology is not limited thereto and various other functional layers may be further formed between the first electrode 141 and the second electrode 145.

In the display device 100 according to the present embodiment, the first and second gate electrodes 114 and 126 are formed in different layers from each other to reduce distances between neighboring gate wirings, in order to realize a display device with an increased resolution.

Also, in order to provide the capacitor Cst with a sufficient electrostatic capacity C in a narrow area, the third insulating layer 117 formed between the lower electrode 136 and the upper electrode 138 of the capacitor Cst may be formed of a material having a high dielectric constant k.

The electrostatic capacity C of the capacitor Cst is substantially proportional to the areas of the lower electrode 136 and the upper electrode 138. However, in a display device having a high resolution, it is difficult to ensure a sufficient area for the electrodes of the capacitor Cst because each of the pixels has a small size. Therefore, the areas of the lower and upper electrodes 136 and 138 may be reduced and the electrostatic capacity C may be also reduced.

Therefore, according to the display device 100 of the present embodiment, the third insulating layer 117 functioning as the dielectric layer of the capacitor Cst is formed of a material having the high dielectric constant k, and thus, the electrostatic capacity C of the capacitor Cst may be improved.

The first and second insulating layers 113 and 115 may include a material having a low dielectric constant such as $SiO_2$, SiNx, SiON, or the like, which is not easily damaged when undergoing various manufacturing processes.

The above materials have a dielectric constant of about 10 or less, and thus, introduce a limitation in increasing the electrostatic capacity C of the capacitor Cst. Therefore, the third insulating layer 117 may include a metal oxide such as $ZrO_2$, $Ta_2O_5$, $Nb_2O_5$, or $HfO_2$ which generally have a large dielectric constant k ranging from about 15 to about 40.

However, when a high temperature is applied to the material having a large dielectric constant k, dielectric breakdown may occur. Therefore, the third insulating layer 117 is formed after performing an annealing process. This will be described later.

Figure 8:
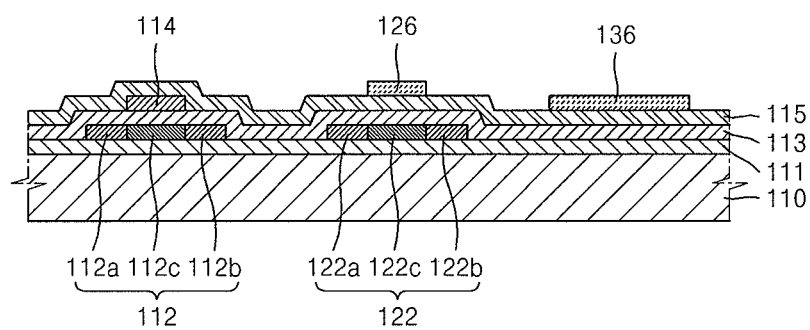
Figure 9:
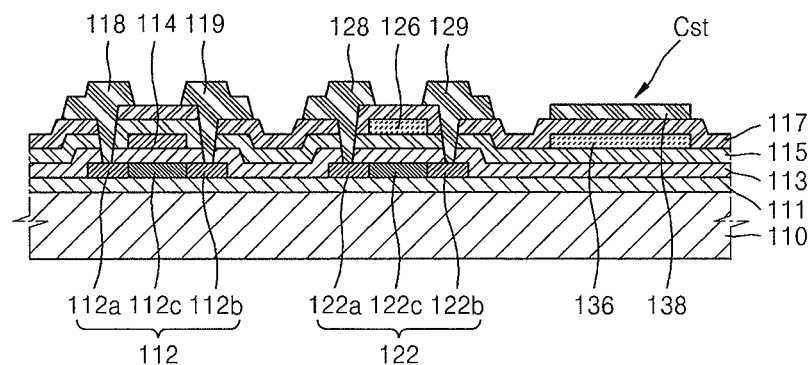
Figure 10:
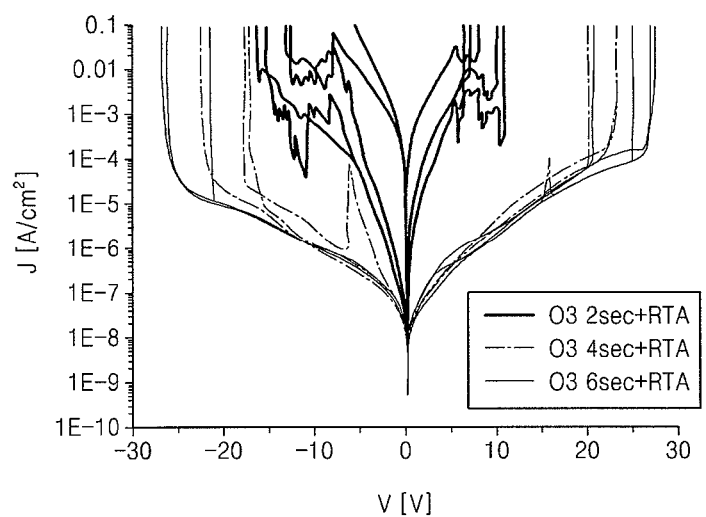
FIG. 10 is a graph showing an insulation breakdown effect when an insulating layer having a high dielectric constant is heated.

FIGS. 5 through 9 are cross-sectional views illustrating a method of manufacturing the display device 100 of FIG. 4, and FIG. 10 is a graph showing the dielectric breakdown occurring when an insulating layer having a large dielectric constant is annealed.

Figure 5:
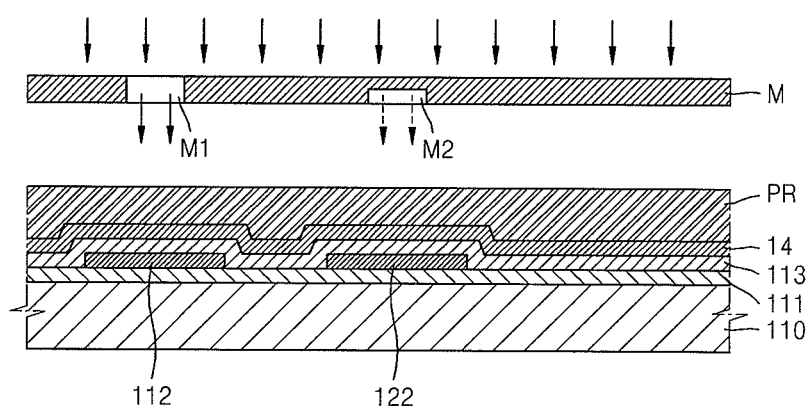
FIGS. 5 through 9 are cross-sectional views illustrating a method of manufacturing the display device of FIG. 4.

Referring to FIG. 5, the buffer layer 111 is formed on the substrate 110 and a semiconductor material is formed on the buffer layer 111. After that, the first and second active layers 112 and 122 are formed through a photolithography process and the first insulating layer 113 is formed on the buffer layer 111 so as to cover the first and second active layers 112 and 122.

A first gate electrode material 14 is formed on the first insulating layer 113. The first gate electrode material 14 may include one or more metal materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu) in a single-layered or a multi-layered structure.

After forming a photoresist PR on the first gate electrode material 14, light is irradiated onto the photoresist PR using a mask M. The mask M may be a halftone mask including a transmission region M1 and a semi-transmission region M2.

The photoresist PR of the present embodiment is a negative type photoresist PR that remains only on regions where the light is irradiated, however, the described technology is not limited thereto, and the photoresist PR may be a positive type photoresist PR that remains only on regions where the light is not irradiated. In this case, the transmission region M1 included in the mask M shown in FIG. 5 is a light blocking region and the light blocking region of FIG. 5 is a transmission region. Even in this case, the semi-transmission region M2 remains a semi-transmission region.

Figure 6:
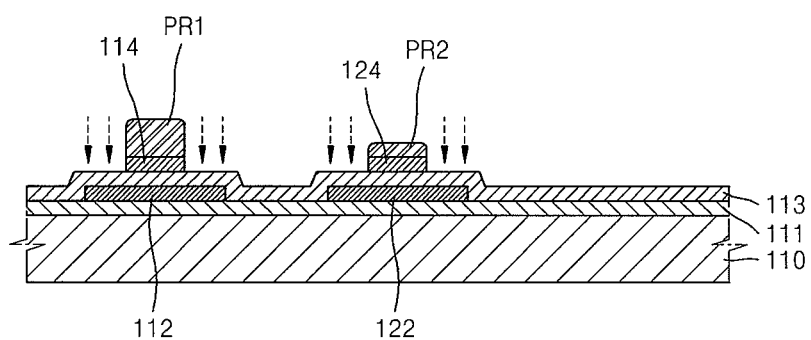

Referring to FIG. 6, after irradiating light through the mask M shown in FIG. 5, the first gate electrode material 14 remaining on the regions where the light is not irradiated is removed through an etching process, and accordingly, the first gate electrode 114 and an additional gate electrode 124 are formed. The etching process may be a dry etching process. Here, a photoresist PR that has been rendered insoluble by the light remains on the first gate electrode 114 and the additional gate electrode 124.

Since the halftone mask is used when irradiating the light, a second photoresist PR2 remaining on the additional gate electrode 124 corresponding to the semi-transmission region M2 of the mask M may be thinner than a first photoresist PR1 remaining on the first gate electrode 114 corresponding to the transmission region M1 of the mask M.

After forming the first gate electrode 114 and the additional gate electrode 124, the first active layer 112 is doped with ion impurities by using the first gate electrode 114 and the first photoresist PR1 as a mask. Similarly, the second active layer 122 is doped with ion impurities by using the additional gate electrode 124 and the second photoresist PR2 as a mask.

Figure 7:
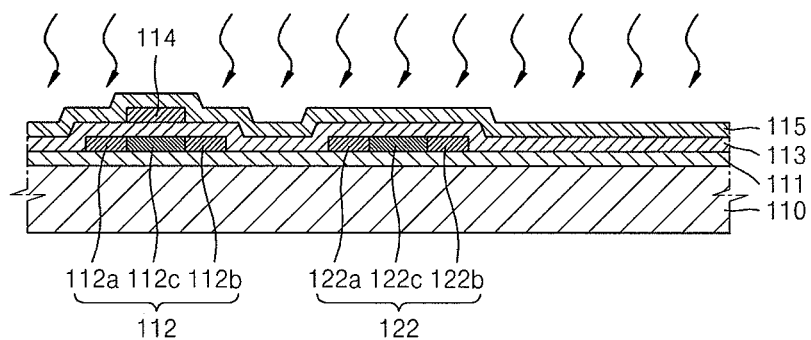

Referring to FIG. 7, the first photoresist PR1, the second photoresist PR2, and the additional gate electrode 124 are removed by an etching process after the doping of the first and second active layers 112 and 122 with the ion impurities and the second insulating layer 115 is formed. That is, the first and second photoresists PR1 and PR2 and the additional gate electrode 124 may be removed at substantially the same time through a dry etching process.

That is, since the first photoresist PR1 is thicker than the second photoresist PR2, the second photoresist PR2 and the additional gate electrode 124 are substantially completely removed after the etching process, however, the first gate electrode 114 is not removed.

After forming the second insulating layer 115 on the remaining first gate electrode 114, a rapid thermal annealing (RTA) process is performed. The RTA process is performed for activating the ion impurities that the first and second active layers 112 and 122 are doped with and may be performed at a temperature of about 500° C. or greater, and in particular, at a temperature of about 580° C. or greater.

Referring to FIG. 8, the second gate electrode 126 is formed on the second insulating layer 115 in an area corresponding to the second active layer 122 and the lower electrode 136 of the capacitor Cst is formed on a region that does not overlap with the first and second active layers 112 and 122.

That is, the second gate electrode 126 and the lower electrode 136 may be formed of the same material and in the same layer as each other. The second gate electrode 126 and the lower electrode 136 may include one or more metal materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu) in a single-layered or a multi-layered structure.

Referring to FIG. 9, after forming the third insulating layer 117 on the second gate electrode 126 and the lower electrode 136, contact holes are formed in the first insulating layer 113, the second insulating layer 115, and the third insulating layer 117. After that, the first source and first drain electrodes 118 and 119, the second source and second drain electrodes 128 and 129, and the upper electrode 138 of the capacitor Cst are formed on the third insulating layer 117.

The third insulating layer 117 may be formed of a material having a large dielectric constant k that may range from about 15 to about 40. For example, the third insulating layer 117 may include a metal oxide such as $ZrO_2$, $Ta_2O_5$, $Nb_2O_5$, or $HfO_2$.

Since the electrostatic capacity of the capacitor Cst is proportional to areas of the lower and upper electrodes 136 and 138 and the dielectric constant of the third insulating layer 117, the third insulating layer 117 may be formed of a material having a large dielectric constant to improve the electrostatic capacity of the capacitor Cst. The above configuration may be suitable for a high resolution display device, in which it is difficult to ensure sufficient space for disposing the lower and upper electrodes 136 and 138.

The first and second source electrodes 118 and 128, the first and second drain electrodes 119 and 129, and the upper electrode 138 may be formed of the same material and in the same layer as each other, and may include one or more metal materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu) in a single-layered or a multi-layered structure.

Although not shown in FIG. 9, the fourth insulating layer 130 (refer to FIG. 4) and the OLED may be formed on the first and second source electrode 118 and 128, the first and second drain electrodes 119 and 129, and the upper electrode 138.

FIG. 10 is a graph showing the result of measuring a current density ($A/cm^2$) according to a voltage V, after forming the lower electrode of the capacitor by using Mo, disposing $ZrO_2$ having a large dielectric constant on the lower electrode, performing an RTA process at a temperature of about 600° C., and forming an upper electrode by using Mo.

As shown in the graph, a dielectric breakdown occurs, whereby the current density rapidly increases according to an increase in the absolute value of the voltage V.

That is, if an insulating material having a large dielectric constant is used in order to increase the electrostatic capacity of the capacitor Cst, the characteristics of the insulating material may be changed during the annealing process.

Thus, according to the display device 100 of the present embodiment, the third insulating layer 117 functioning as a dielectric layer of the capacitor Cst is formed after performing an annealing process that is necessary for activating the ion impurities that the first and second active layers 112 and 122 are doped with, and thus, deformation of the third insulating layer 117 having a large dielectric constant due to the heat of the annealing process and the resulting damage to the capacitor Cst may be substantially prevented.

Figure 11:
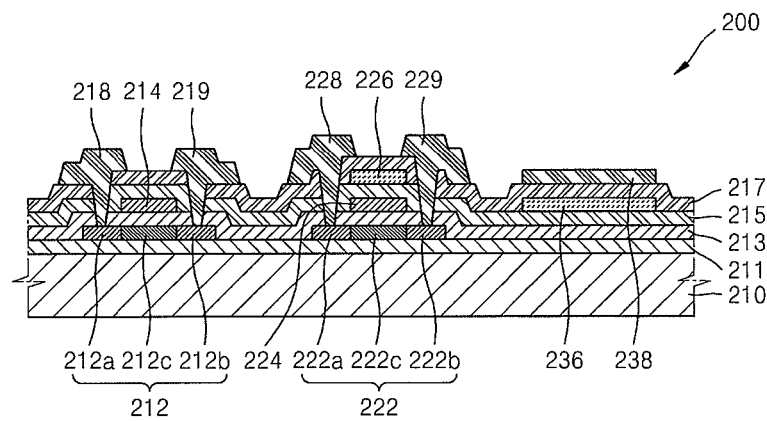
FIG. 11 is a schematic cross-sectional view of a display device according to another embodiment.

FIG. 11 is a schematic cross-sectional view of a display device 200 according to another embodiment.

First and second active layers 212 and 222 are formed on a substrate 210 of the display device 200 shown in FIG. 11. The first active layer 212 includes a first source region 212a, a first drain region 212b, and a first channel region 212c, and the second active layer 212 includes a second source region 222a, a second drain region 222b, and a second channel region 222c.

A buffer layer 211 substantially preventing impurities from penetrating into the first and second active layers 212 and 222 and substantially planarizing the substrate may be formed between the substrate 210 and the active layers 212 and 222.

A first insulating layer 213 is formed on the first and second active layers 212 and 222. A first gate electrode 214 is formed on the first insulating layer 213 in an area corresponding to the first active layer 212, and a third gate electrode 224 is formed on the first insulating layer 213 in an area corresponding to the second active layer 222.

The second gate electrode 224 may be a floating gate electrode that is not electrically connected to other electrodes or wirings and acts as a mask when the second source and second drain regions 222a and 222b of the second active layer 222 are doped with ion impurities during the manufacturing processes.

A second insulating layer 215 may be formed on the first and third gate electrodes 214 and 224 and a second gate electrode 226 may be formed on the second insulating layer 215 in an area corresponding to the second active layer 222.

Also, the lower electrode 236 of a capacitor Cst is formed on the second insulating layer 215 so as not to overlap with the first and second active layers 212 and 222. That is, the second gate electrode 226 and the lower electrode 236 of the capacitor Cst may be formed in the same layer as each other.

A third insulating layer 217 is formed on the second gate electrode 226 and the lower electrode 236 of the capacitor Cst. The third insulating layer 217 functions as a dielectric layer of the capacitor Cst and has a dielectric constant k that is greater than those of the first and second insulating layers 213 and 215. Here, the dielectric constant k may be about 15 or greater.

A first source electrode 218 and a first drain electrode 219 are respectively electrically connected to the first source region 212a and the first drain region 212b of the first active layer 212 via contact holes and are formed on the third insulating layer 217. A second source electrode 228 and a second drain electrode 229 are electrically connected to the second source region 222a and the second drain region 222b of the second active layer 222 and are formed on the third insulating layer 217. An upper electrode 238 of the capacitor Cst facing the lower electrode 236 is also formed on the third insulating layer 217.

That is, the first and second source electrodes 218 and 228, the first and second drain electrodes 219 and 229, and the upper electrode 238 may be formed in the same layer as each other.

According to the display device 200 of the present embodiment, there is no need to remove the third gate electrode 224 that is used as a mask when the second active layer 222 is doped with ion impurities during the manufacturing processes, and thus, the halftone mask and the process of removing the additional gate electrode 124 through the etching process after doping with the ion impurities, which are necessary for manufacturing the display device 100 of FIG. 4, may be omitted.

As described above, according to at least one embodiment, a capacitor having an improved capacity may be substantially prevented from being damaged during the manufacturing processes.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the described technology have been described with reference to the figures, it will be understood by those of ordinary skill in the art that various changes in form and details may be made therein without departing from the spirit and scope of the present invention as defined by the following claims.

What is claimed is:

1. A method of manufacturing a thin film transistor (TFT) array substrate, comprising:
    forming an active layer over a substrate;
    forming a first insulating layer over the substrate to cover the active layer;
    forming a first gate electrode over the first insulating layer, wherein the first gate electrode is formed substantially directly above at least a portion of the active layer;
    doping the active layer with ion impurities;
    forming a second insulating layer over the first insulating layer to cover the first gate electrode, wherein the second insulating layer includes top and bottom surfaces opposing each other, and wherein the bottom surface faces the substrate;
    performing an annealing process on the active layer;
    forming a lower electrode of a capacitor over the second insulating layer, wherein the top surface of the second insulating layer contacts the lower electrode;
    forming a third insulating layer over the second insulating layer to cover the lower electrode, wherein the third insulating layer has a dielectric constant greater than those of the first and second insulating layers; and
    forming an upper electrode of the capacitor over the third insulating layer.

2. The method of claim 1, wherein the forming of the active layer comprises forming a first active layer and a second active layer.

3. The method of claim 2, wherein the forming of the lower electrode comprises substantially simultaneously forming i) a second gate electrode over the third insulating layer to be substantially directly above at least a portion of the second active layer and ii) the lower electrode of the capacitor.

4. The method of claim 2, wherein the forming of the first gate electrode comprises forming the first gate electrode and a third gate electrode to be substantially directly above at least portions of the first and second active layers, respectively, and wherein the doping of the active layer comprises doping the first active layer and the second active layer with ion impurities.

5. The method of claim 4, wherein the third gate electrode comprises a floating gate electrode.

6. The method of claim 4, wherein the forming of the first and third gate electrodes comprises using a halftone mask having a transmission region which is formed substantially directly above at least a portion of the first gate electrode and a semi-transmission region which is formed substantially directly above at least a portion of the third gate electrode.

7. The method of claim 6, wherein the forming of the first and third gate electrodes comprises:
    forming a gate electrode layer over the first insulating layer;
    selectively etching the gate electrode layer via the halftone mask to form the first and third gate electrodes;
    doping the first and second active layers with ion impurities using the first and third gate electrodes as masks; and
    etching the third gate electrode from the substrate.

8. The method of claim 1, wherein the forming of the upper electrode of the capacitor comprises substantially simultaneously forming over the third insulating layer i) a source electrode and a drain electrode to be substantially directly above at least a portion of the active layer and ii) the upper electrode of the capacitor.

9. The method of claim 1, wherein the third insulating layer has a dielectric constant ranging from about 15 to about 40.

10. A thin film transistor (TFT) array substrate, comprising:
    an active layer formed over the substrate;
    a first insulating layer formed over the substrate to cover the active layer;
    a first gate electrode formed over the first insulating layer, wherein the first gate electrode is formed substantially directly above at least a portion of the active layer;
    a second insulating layer formed over the first insulating layer to cover the first gate electrode, wherein the second insulating layer includes top and bottom surfaces opposing each other, and wherein the bottom surface faces the substrate;
    a lower electrode of a capacitor formed over the second insulating layer, wherein the top surface of the second insulating layer contacts the lower electrode;

a third insulating layer formed over the second insulating layer to cover the lower electrode, wherein the third insulating layer has a dielectric constant greater than those of the first and second insulating layers; and an upper electrode of the capacitor formed over the third insulating layer.

11. The TFT array substrate of claim 10, wherein the active layer comprises a first active layer and a second active layer.

12. The TFT array substrate of claim 11, further comprising a second gate electrode formed over the second insulating layer, wherein the second gate electrode is formed substantially directly above at least a portion of the second active layer, and wherein the second gate electrode is formed in the same layer as that of the lower electrode.

13. The TFT array substrate of claim 11, further comprising a third gate electrode formed substantially directly above at least a portion of the second active layer, wherein the third gate electrode is a floating gate electrode.

14. The TFT array substrate of claim 10, wherein the active layer comprises i) a source region and a drain region doped with ion impurities, and ii) a channel region connecting the source and drain regions to each other, wherein the TFT array substrate further comprises a source electrode and a drain electrode that are respectively electrically connected to the source and drain regions and formed over the third insulating layer to be substantially directly above at least portions of the source and drain regions, respectively, and wherein the source and drain electrodes are formed in the same layer as that of the upper electrode.

15. A display device comprising:
a substrate; and
a plurality of pixels, each including a pixel circuit comprising:
an active layer formed over the substrate;
a first insulating layer formed over the substrate to cover the active layer;
a first gate electrode formed over the first insulating layer in an area corresponding to the active layer;
a second insulating layer formed over the first insulating layer to cover the first gate electrode, wherein the second insulating layer includes top and bottom surfaces opposing each other, and wherein the bottom surface faces the substrate;
a lower electrode of a capacitor formed over the second insulating layer, wherein the top surface of the second insulating layer contacts the lower electrode;
a third insulating layer formed over the second insulating layer to cover the lower electrode, wherein the third insulating layer has a dielectric constant that is greater than those of the first and second insulating layers; and
an upper electrode of the capacitor formed over the third insulating layer.

16. The display device of claim 15, wherein the active layer comprises a first active layer and a second active layer.

17. The display device of claim 16, further comprising a second gate electrode formed over the second insulating layer, wherein the second gate electrode is formed substantially directly above at least a portion of the second active layer, wherein the second gate electrode is formed in the same layer as that of the lower electrode.

18. The display device of claim 16, further comprising a third gate electrode formed between the second gate electrode and the second active layer, wherein the first gate electrode is formed substantially directly above at least a portion of the first active layer, and wherein the third gate electrode is a floating gate electrode.

19. The display device of claim 15, wherein the active layer comprises i) a source region and a drain region doped with ion impurities and ii) a channel region connecting the source and drain regions to each other, wherein the display device further comprises a source electrode and a drain electrode that are respectively electrically connected to the source and drain regions and formed over the third insulating layer to be substantially directly above at least portions of the source and drain regions, respectively, and wherein the source and drain electrodes are formed in the same layer as that of the upper electrode.

20. The display device of claim 15, further comprising an organic light-emitting diode (OLED) comprising a first electrode, a second electrode, and an organic emission layer interposed between the first and second electrodes.

* * * * *